US006346177B2

(12) United States Patent
Leiphart

(10) Patent No.: US 6,346,177 B2
(45) Date of Patent: *Feb. 12, 2002

(54) METHOD OF IN-SITU CLEANING AND DEPOSITION OF DEVICE STRUCTURES IN A HIGH DENSITY PLASMA ENVIRONMENT

(75) Inventor: Shane P. Leiphart, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/759,876

(22) Filed: Jan. 12, 2001

Related U.S. Application Data

(63) Continuation of application No. 08/775,589, filed on Jan. 2, 1997, now Pat. No. 6,187,151.

(51) Int. Cl.[7] .......................... C23C 14/34; B08B 6/00; C25F 1/00; C25F 3/30; C25F 5/00
(52) U.S. Cl. ..................... 204/192.3; 204/192.12; 204/192.15; 204/192.2; 204/192.23; 134/1.1
(58) Field of Search .................... 204/192.3, 192.15, 204/192.12, 192.2, 192.23; 134/1.1

(56) References Cited

U.S. PATENT DOCUMENTS

| | | | | |
|---|---|---|---|---|
| 4,354,911 A | | 10/1982 | Dodd et al. ............ 204/192 EC |
| 4,745,338 A | * | 5/1988 | Hollis, Jr. et al. ....... 315/111.71 |
| 4,874,494 A | | 10/1989 | Ohmi ...................... 204/192.12 |
| 4,999,096 A | * | 3/1991 | Nihei et al. .............. 204/192.3 |
| 5,030,319 A | | 7/1991 | Nishino et al. ............. 156/635 |
| 5,380,401 A | | 1/1995 | Jones et al. .................. 156/665 |
| 5,403,435 A | | 4/1995 | Cathey et al. ............... 156/643 |
| 5,409,563 A | | 4/1995 | Cathey ........................ 156/643 |
| 5,770,023 A | | 6/1998 | Sellers ....................... 204/192.3 |
| 6,187,151 B1 | * | 2/2001 | Leiphart ................... 204/192.3 |
| 6,187,682 B1 | * | 2/2001 | Denning et al. ............. 438/694 |

OTHER PUBLICATIONS

Chapman, B., "Glow Discharge Processes," John Wiley & Sons, Inc., pp. 7, 190–191, 195, 221, (1980).

Merriam–Webster's Collegiate Dictionary, 10th ed., p. 863, (1996).

Saito et al., "Plasmaless cleaning process of silicon surface using cholorine triflouride," *Appl. Phys. Lett.,* 56(12), pp. 1119–1121 (1990).

Singer, "Filling Contacts and Vias: A Progress Report," *Semiconductor International,* pp. 89–94 (Feb. 1996).

Vossen, J.L. et al., "Thin Film Processes," Academic Press, Inc., 111 Fifth Ave., NY,10003, pp. 41–45 (1978).

* cited by examiner

*Primary Examiner*—Nam Nguyen
*Assistant Examiner*—Steven H. VerSteeg
(74) *Attorney, Agent, or Firm*—Mueting, Raasch & Gebhardt, P.A.

(57) ABSTRACT

A method of in-situ cleaning and deposition of device structures in a high density plasma environment. A device structure is located in a reaction chamber containing a sputter target. A high density plasma containing ionized gas particles is generated. The ionized gas particles are accelerated toward the device structure during a cleaning phase. The cleaning phase may be divided into a first cleaning phase during which no power is applied to the sputter target and a second cleaning phase during which power is supplied to the sputter target at a level sufficient to remove at least a portion of by-products deposited on the sputter target during the first cleaning phase.

26 Claims, 2 Drawing Sheets

METHOD OF IN-SITU CLEANING AND DEPOSITION OF DEVICE STRUCTURES IN A HIGH DENSITY PLASMA ENVIRONMENT

This is a continuation of application Ser. No. 08/775,589, filed on Jan. 2, 1997, now U.S. Pat. No. 6,187,151 which is incorporated herein by reference.

FIELD OF THE INVENTION

The present invention is directed to a method of in-situ cleaning and deposition of device structures in a high density plasma environment.

BACKGROUND OF THE INVENTION

Plasma cleaning or etching is a process whereby a gas is subject to a radio frequency electric field in a reaction chamber to form a plasma. A plasma is a gas which contains positive, negative and neutral atoms, electrons and/or molecules including radicals and a "gas" of emitted photons. A chemically inert gas, such as argon, is ionized to form the plasma and accelerated to impinge on a device structure so that material is removed from the surface of the device structure by momentum transfer, a process similar to sand blasting. The ions/radicals interact with the surface of the atoms or molecules within the material to be cleaned or etched and in some circumstances forming a volatile by-product which is subsequently removed from the reaction chamber.

One form of cleaning uses a high density plasma source for bombarding the device structure. High density plasma cleaning utilizes a lower direct current (DC) offset voltage to accelerate the ionized particles toward the device structure than conventional plasma cleaning techniques. The lower offset voltage allows for cleaning with less chance of device damage often caused by high energy ion impacts.

Sputter deposition refers to a mechanism in which atoms are dislodged from a target material by collision with high energy particles. The sputtering process involves generating and directing ions at a target. The momentum of ions incident on the target is transferred to the surface atoms of the target material, causing their ejection. A portion of the ejected sputtered species from the target are accelerated in an electric field toward a device structure, although the vast majority of the sputtered species are neutral. The ejected atoms from the target condense on the surface of the device structure to form the desired film.

Cleaning and sputter deposition are typically performed in separate chambers requiring the device structures to be moved from chamber to chamber. Handling of the device structures may expose them to contamination, the formation of native oxide thereon, or damage, and generally requires an extra chamber.

SUMMARY OF THE INVENTION

The present invention includes a method for in-situ plasma cleaning and sputter deposition in a single high density plasma chamber during the processing of a device structure. The present method is particularly useful for cleaning high aspect ratio device structures.

A device structure is located in a reaction chamber containing a sputter target. A high density plasma containing ionized gas particles is generated in the reaction chamber. The ionized gas particles are accelerated toward the device structure during a cleaning phase. At least a portion of by-products produced during the cleaning phase are evacuated from the reaction chamber. The ionized gas particles are then accelerated toward the sputter target during a deposition phase so that a layer of sputter target material is deposited on at least a portion of the device structure.

The cleaning phase may be divided into a first cleaning phase during which no power is applied to the sputter target and a second cleaning phase during which power is supplied to the sputter target sufficient to remove at least a portion of by-products deposited on the sputter target during the first cleaning phase. The step of providing power to a sputter target preferably includes the step of providing power at a level that results in substantially no deposition of the sputter target material on the device structure. Power of about 0–1 watt/cm$^2$ is typically provided to a sputter target during the second cleaning phase.

In an alternate embodiment, the ion containing gas used during the cleaning phase is different from the ion containing gas used during deposition phase.

Low power in the range of about 0 to 1 watt/cm$^2$ may be applied to the sputter target during a second cleaning phase. Pressure within the reaction chamber is preferably maintained in the range of about 10 to 100 mtorr during the cleaning phase. The step of biasing the device structure includes the step of providing a bias in the range of about 50 to 150 volts. The high density plasma generally has at least $10^{11}$ particles per cubic centimeters. The sputter target is generally selected from the group consisting of Ti, Pt, Mo, W, Au, Ni, Co, Al, Ta, Si and combinations thereof.

DETAILED DESCRIPTION OF SPECIFIC EMBODIMENTS

As used in this application: By-products refers to material removed from the surface of the device structure during cleaning or non-chemically reactive dry etching; low density plasma refers to a particle density of less than $10^{11}$ particles per cubic centimeter; high density plasma refers to a particle density of greater then or equal to $10^{11}$ particles per cubic centimeter; target species refers to atoms or ions ejected from a sputter target; substrate structure refers to the base silicon wafer, one or more semiconductor layers or structures that may include active or operable portions of semiconductor devices; device structure refers to a substrate structure and any other layers or films for forming features including without limit trenches, vias, holes, depressions, interconnects and the like.

The present method contemplates any dry cleaning process using any known plasma containing gas. During the cleaning phase, the high density plasma cleaning occurs with little or no sputter target (cathode) discharge. Alternatively, low power may be applied to the sputter target during a portion of the cleaning phase so that a small amount of sputtering occurs at the target to minimize the build-up of by-products removed from the device structure during cleaning. The cleaning may involve selective removal of materials, such as at a contact or exposed metal surface, or cleaning of the entire surface of the device structure. The cleaning is preferably performed in-situ prior to deposition so as to minimize handling of the device structure. The composition of the ionized gas particles can vary from the cleaning phase to the deposition phase.

In a high density plasma environment, about twenty percent or more of the target species are ionized, as opposed to about five percent or less using standard sputter deposition. The ionized target species are more effectively drawn perpendicular to the surface of the device structures by the bias on the table. Consequently, the present high plasma environment is particularly well suited for cleaning and deposition at the bottom of surface features, and particularly at the bottom of high aspect ratio surface features. It will be understood, however, that cleaning a planar surface, as opposed to a high aspect ratio device structure, may also be performed using the present method.

Figure 1:
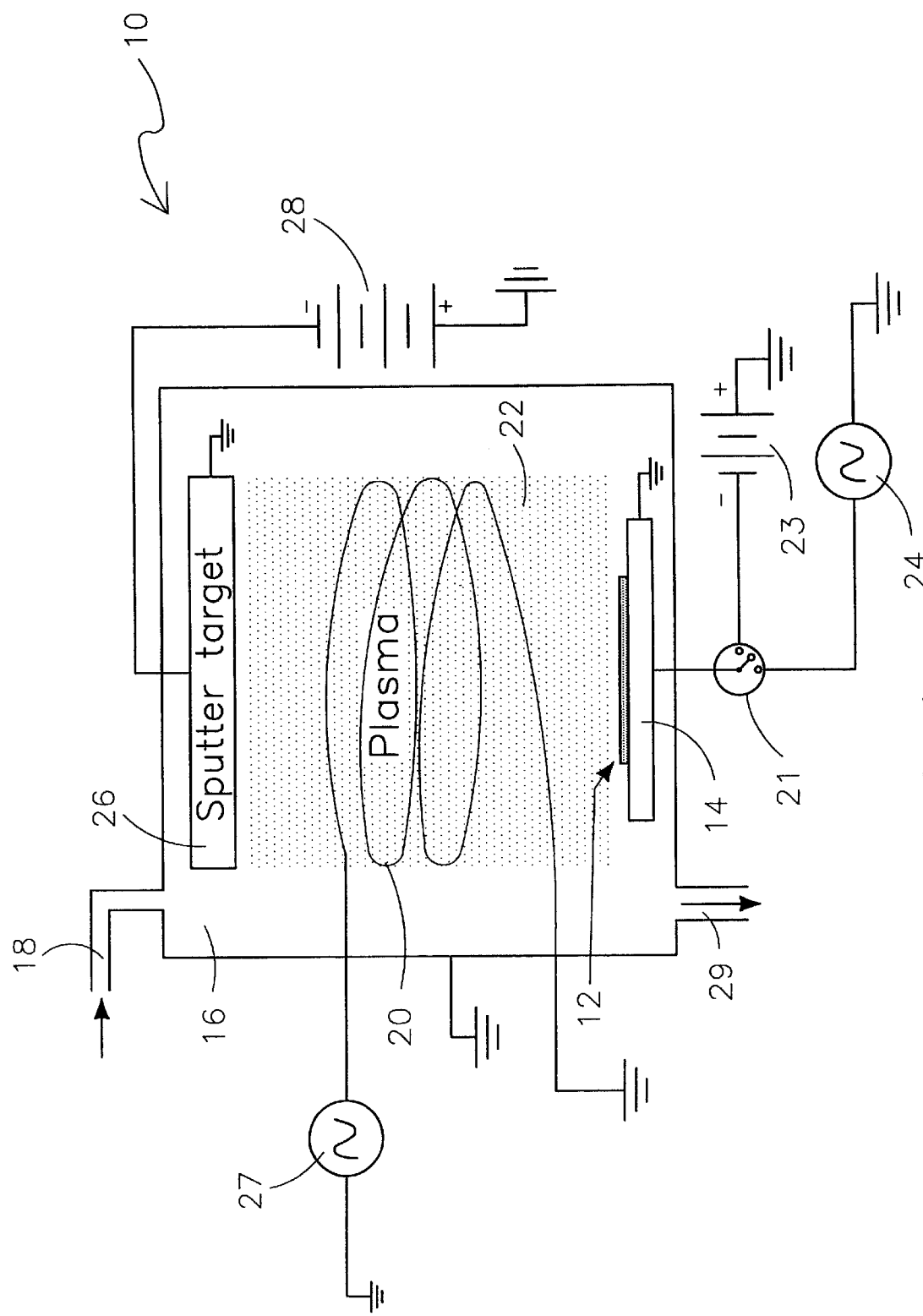
FIG. 1 is a schematic illustration of a reaction chamber suitable for both high density plasma cleaning and sputter deposition.

FIG. 1 is a schematic illustration of a reactor 10 suitable for use with the present in-situ cleaning method using a high density plasma deposition chamber. A conductive substrate table 14 containing device structure 12, such as a silicon wafer, is located in a reaction chamber 16. The table 14 is connected to a power source 24 for supplying an RF voltage. The power source 24 typically operates in a range of about 400 kHz to 60 MHZ. The RF voltage provides a bias on device structures having insulating layers, such as native oxide layers. In an alternate embodiment, a DC power source may be used to bias the table 14. A switch 21 is provided to permit selection of the RF voltage source 24 or the DC power source 23.

A gas inlet 18 is provided for introduction of a plasma gas, such as argon or oxygen, into the chamber 16. An inductive coil 20 connected to a power source 27 is located in the chamber 16. The inductive coil 20 provides an electromagnetic field that ignites the plasma gas to form high density plasma 22. The power source 27 typically provides an RF voltage in a range of about 400 kHz to 60 MHZ. The high density plasma 22 preferably contains at least $10^{11}$ particles per cubic centimeter. A sputter target 26 connected to a DC power source 28 is located in the chamber 16. The sputter target 26 is typically constructed from Ti, Pt, Mo, W, Au, Ni, Co, Al, Ta, Si or combinations thereof. Reaction by-products are drawn from the reaction chamber 16 through a vent 29 by a vacuum pump (not shown).

In a first embodiment of the cleaning process, no voltage is applied to sputter target 26 by power source 28. An inert gas is ignited by coil 20 to produce the high density plasma 22, without sputtering the sputter target 26. Gas ions are drawn toward the device structure 12 from the high density plasma 22 by a bias on the conductive substrate table 14. The substrate table 14 is typically maintained at a negative voltage of 50–150 volts with respect to ground so that the ions in the plasma are pulled toward the biased substrate table 14. The gas ions have energies in the range of about 0 to 50 eV in the plasma. The combination low energy plasma ions and no target power minimizes the quantity of plasma ions that reach the sputter target 26. The gas ions clean the surface of the device structure 12 and cause the ejection of by-products. The by-products mix with the plasma gas and can be removed through the vent 29. Some of the by-products may adhere to the walls of the reaction chamber 16.

The high density plasma 22 of the present embodiment provides the advantage of low ion energy bombardment of the device structure 12 with minimal simultaneous discharge of target species or premature deposition on the device structure 12. The lower energy ions of the plasma 22 (for a given power level) allow for cleaning with less chance of damage to devices on the device structure 12 and provides a higher ion current for the same power level.

It is possible that material removed from the device structure may reach the sputter target 26 and contaminate its surface. In an alternate embodiment, the cleaning phase is divided into a first cleaning phase and a second cleaning phase. During the first cleaning phase, power is not applied to the sputter target. During the second cleaning phase, very low power in the range of about 0 to 1 watt/cm$^2$ is applied to the sputter target 26 to cause a small quantity of sputtering of the sputter target 26. Sputtering the sputter target 26 during the second cleaning phase removes some of the contamination that may accumulate. It will be understood that the power applied to the sputter target 26 will vary depending upon the pressure and dimensions of the reaction chamber 16.

The reaction chamber 16 is preferably maintained in the range of about 10 to 100 mtorr during the cleaning phases. A portion of the sputtered by-products are removed from the chamber 16 along with the inert gas evacuated through the vent 29 and a portion adheres to the interior walls of the reaction chamber 16.

In an alternate embodiment, the cleaning phase may be operated at high pressure (in the range of $50^{-3}$ torr) to cause severe gas phase scattering. Since the chamber walls represent the greatest surface area in the system, the gas phase collisions should cause deposition of the material sputtered from the device structure 12 onto the walls of the chamber 16. It will be understood that low power on the sputter target 26 and high pressure in the chamber 16 may be used separately or in combination during any portion of the cleaning phase to minimize deposition of by-products on the device structure 12.

During the deposition phase, the reactor 10 of FIG. 1 may operate as a simple diode DC sputtering chamber, as discussed above. Electrons and ions are accelerated in the electric field created by a DC power source 28 between the conductive substrate table 14 (anode) and a sputter target 26 (cathode). The same plasma containing gas used during the cleaning phase may be utilized during the deposition phase. In an alternate embodiment, the chamber 16 is evacuated and a different plasma containing gas is introduced through the gas inlet 18 for the deposition phase. For example, the cleaning phase may utilize oxygen and the deposition phase argon. In an embodiment in which argon is used to form the plasma for the deposition phase, the accelerated electrons collide with argon atoms, causing their ionization and generating secondary electrons. The new electrons acquire sufficient energy from the electric field to ionize new argon atoms, forming the plasma 22 near the exposed surface of the sputter target 26. The argon ions are accelerated to the negatively charged sputter target 26 by power source 28 where they sputter surface atoms of the sputter target 26 by momentum transfer. The sputtered target species are then ionized and drawn to the device structure 12 and the substrate table 14 by a bias generated by RF power source 24 or DC power source 28.

The incident ion energy must be large enough to dislodge target atoms, but low enough to minimize penetration of ions into the target material (ion implantation). Sputtering ion energies are typically in the range of about 50 eV to 2 keV. Sputtered atoms typically have energies of about 0 to 10 eV. It is desirable that as many of these sputtered atoms as possible be deposited upon the device structures and form the specified film. To accomplish this goal, the sputter target 26 and device structure 12 are closely spaced, typical about 5–15 cm apart.

Sputtering yield generally refers to the number of target atoms ejected per incident ion, typically in the range of about 0.5–1.5. Sputtering yield largely determines the rate of sputter deposition. Sputtering yield depends on a number of factors besides the direction of incident ions, including target material, mass of bombarding ions, the energy of the bombarding ions, dose, crystal state and surface binding energy.

Figure 2:
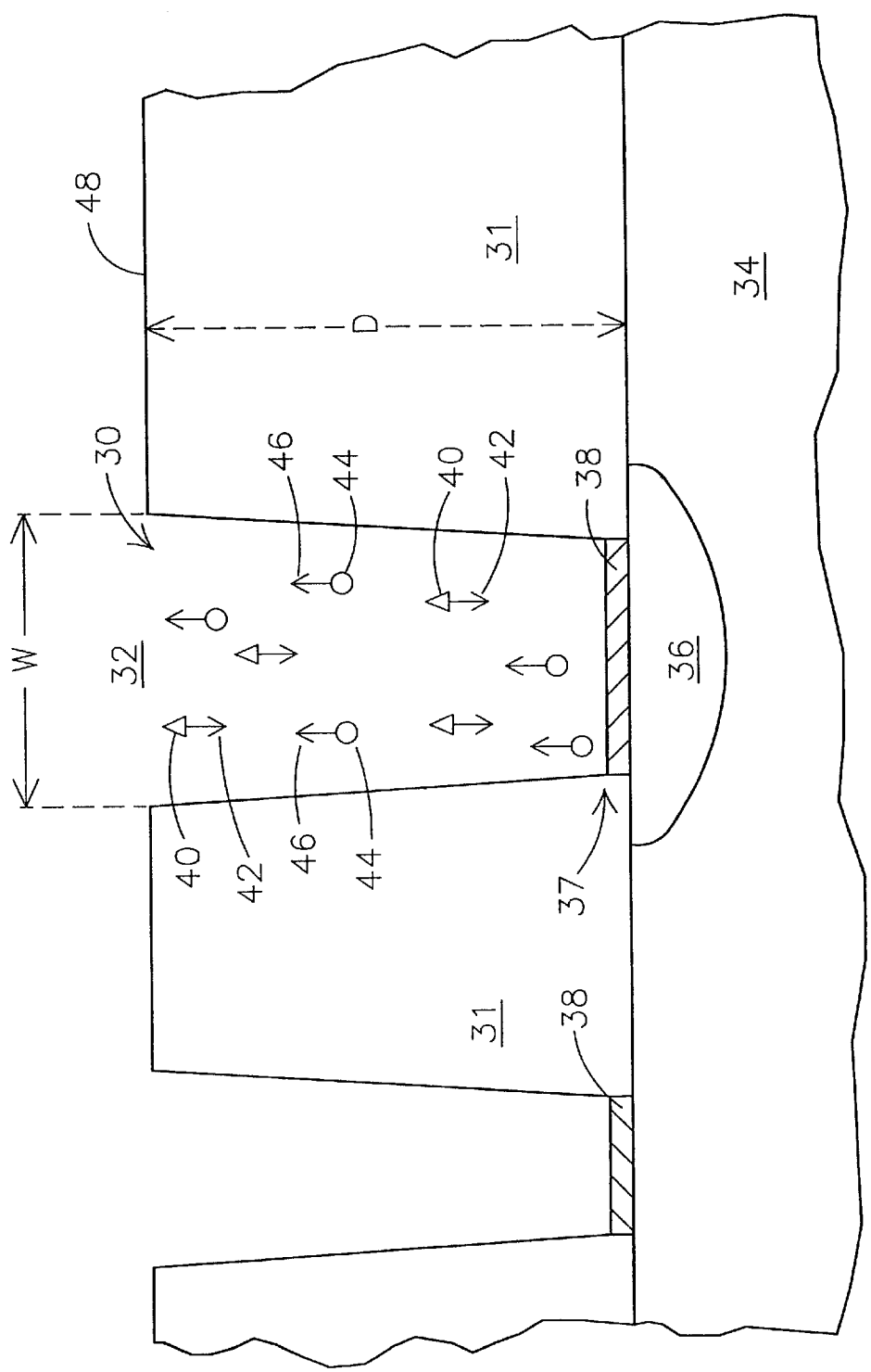
FIG. 2 is a schematic illustration of a pair of adjacent high aspect ratio contacts being sputter cleaned during a cleaning phase.

FIG. 2 illustrates a high aspect ratio device structure 30 in a borophosphosilicate glass (BPSG) layer 31 on a silicon substrate 34 having an opening 32. A doped silicon region 36 at bottom 37 of the device structure 30 is covered by a native oxide layer 38. The device structure 30 has a width "W" and a depth "D", yielding an aspect ratio of D:W.

The movement of plasma gas ions 40 is indicated by downward arrows 42 toward the bottom surface 37 of the device structure 30. Movement of the plasma gas ions 40 is anisotropic in nature. The anisotropic movement of the plasma gas ions 40 is useful for cleaning or non-chemically reactive dry etching high aspect ratio features on the device structure. Reaction by-products 44 are indicated by the circles. If the by-products 44 are thermalized by collisions in a high pressure environment (such as pressure >50 mtorr), thermally random diffusion will result. The net diffusion is upward through the opening 32 of the device structure 30 as indicated by upward arrows 46. The by-products 44 are evacuated from the chamber 16 through the vent 29 or otherwise adhere to the wall of the reaction chamber 16.

High aspect ratio device structures, such as device structure 30, may fall in the range of about 1:1 to about 5:1, and more likely in a range of about 1:1 to about 20:1, although it will be understood that aspect ratios in the range of about 1:1 to about 40:1 are possible. The present high density plasma cleaning method is well suited for use on device structures having one or more lateral dimensions W of less than about 2 microns, although device structures less than about 0.5 micron may be cleaned.

EXAMPLE

A wide body deposition chamber obtained from Applied Materials, Inc. of Santa Clara, Calif. under product designation Endura 5500 PVD tool was modified to add a water cooled, three-turn titanium coil. The coil, also available from Applied Material, Inc., was configured with an inside diameter of about 22.9 cm (9 inches) and arranged concentrically over the 20.3 cm (8 inch) wafer table in the reaction chamber. The coil tubing had a 6.35 mm (0.25 inch) diameter.

A blank silicon wafer with a 200–300 angstrom thick layer of TEOS was located on the wafer table in the reaction chamber. During the first portion of the cleaning phase, no power was applied to the titanium target. The target was spaced 15 cm above the wafer table. The chamber was maintained at approximately 50 mtorr. The coil was operated for 30–45 seconds at 2 MHZ at a power level of 1200 watts. The wafer table was operated at about 75 volts (250 watts).

During the second portion of the cleaning phase, 500 watts of power was applied to the titanium target to keep it clean. The chamber was maintained at approximately 50 mtorr. The coil was operated for 30–45 seconds at 2 MHZ at a power level of 1000 watts. The wafer table was operated at about 100 volts (300 watts). Virtually no deposition occurred on the wafer.

During the deposition phase, 6000 watts of power was applied to the titanium target. The chamber was maintained at approximately 30 mtorr. The coil was operated for 45 seconds at 2 MHZ at a power level of 1500 watts. The wafer table was operated at about 200 watts (250° C.). Secondary Ion Mass Spectrometer (SIMS) analysis was performed on the test wafer to evaluate the presence of contaminants. The impurities found in the wafer were believed to be the result of impurities in the coil.

The present invention has now been described with reference to several embodiments described herein, particularly with respect to articles having device structures. It will be apparent to those skilled in the art that many changes can be made in the embodiments without departing from the scope of the invention. Thus, the scope of the present invention should not be limited to the structures described herein, but only to structures described by the language of the claims and the equivalents to those structures.

What is claimed is:

1. A method of in-situ cleaning and deposition, comprising:

locating a device structure in a reaction chamber containing a sputter target;

generating a high density plasma containing ionized gas particles in the reaction chamber during a cleaning phase to clean at least a portion of the device structure, and providing power to the sputter target at a level sufficient to remove at least some of any by-products deposited on the sputter target during the cleaning phase and at a level that results in substantially no deposition of sputter target material on the device structure; and evacuating at least a portion of the by-products produced during the cleaning phase from the reaction chamber.

2. The method of claim 1, wherein the method further comprises accelerating ionized gas particles toward the sputter target during a deposition phase so that sputter target material is deposited on at least a portion of the device structure, wherein the cleaning phase is completed prior to the deposition phase.

3. The method of claim 2, further comprising generating plasma prior to the deposition phase.

4. The method of claim 3, wherein generating plasma prior to the deposition phase comprises generating plasma containing ionized gas particles having energies in the range of about 50 eV to 2 keV.

5. The method of claim 1, further comprising maintaining a pressure within the reaction chamber in the range of about 10 to 100 mtorr during the cleaning phase.

6. The method of claim 1, further comprising providing a negative voltage bias within a range of about 50 to 150 volts to the device structure during at least a portion of the cleaning phase.

7. The method of claim 1, wherein generating the high density plasma containing ionized gas particles during the cleaning phase comprises generating ionized gas particles having energies in the range of about 0 to 50 eV.

8. The method of claim 1, wherein the sputter target is selected from the group consisting of Ti, Pt, Mo, W, Au, Ni, Co, Al, Ta, Si and combinations thereof.

9. The method of claim 1, wherein the high density plasma comprises at least $10^{11}$ particles per cubic centimeter.

10. The method of claim 1, wherein the device structure comprises a high aspect ratio device structure.

11. A method of in-situ cleaning and deposition, comprising:

locating a device structure in a reaction chamber containing a sputter target;

generating a high density plasma containing ionized gas particles in the reaction chamber during a first cleaning phase to clean at least a portion of the device structure, wherein the device structure is cleaned and by-products are produced from contact between the ionized gas particles and the device structure;

providing power to the sputter target during a second cleaning phase sufficient to remove at least a portion of any of the by-products deposited on the sputter target during the first cleaning phase, the power provided at a level that results in substantially no deposition of sputter target material on the device structure; and evacuating at least a portion of the by-products from the reaction chamber.

12. The method of claim 11, wherein the method further comprises accelerating ionized gas particles toward the sputter target during a deposition phase so that sputter target material is deposited on at least a portion of the device structure, wherein the deposition phase occurs after the completion of the second cleaning phase.

13. The method of claim 11, further comprising applying power to the sputter target in the range of about 0 to 1 watt/cm$^2$ during the second cleaning phase.

14. A method of in-situ cleaning and deposition, the method comprising:

providing an opening defined in a device structure;

locating the device structure in a reaction chamber containing a sputter target;

generating a high density plasma containing ionized gas particles in the reaction chamber during a cleaning phase to clean at least a portion of the defined opening, and providing power to the sputter target at a level sufficient to remove at least some of any by-products deposited on the sputter target during the cleaning phase and at a level that results in substantially no deposition of sputter target material on the device structure; and evacuating at least a portion of the by-products produced during the cleaning phase from the reaction chamber.

15. The method of claim 14, wherein the method further comprises accelerating ionized gas particles toward the sputter target during a deposition phase so that sputter target material is deposited in at least a portion of the defined opening, wherein the cleaning phase is completed prior to the deposition phase.

16. The method of claim 14, wherein the defined opening comprises one or more of a trench, via, hole, depression, or interconnect.

17. A method of in-situ cleaning and deposition, the method comprising:

providing an opening defined in a device structure;

locating the device structure in a reaction chamber containing a sputter target;

generating a high density plasma containing ionized gas particles in the reaction chamber during a cleaning phase to clean at least the defined opening, and providing power to the sputter target at a level sufficient to remove at least some of any by-products deposited on the sputter target during the cleaning phase and at a level that results in substantially no deposition of sputter target material on the device structure;

evacuating at least a portion of the by-products produced during the cleaning phase from the reaction chamber; and accelerating ionized gas particles toward the sputter target during a deposition phase so that sputter target material is deposited in at least a portion of the defined opening, wherein the cleaning phase is completed prior to the deposition phase.

18. The method of claim 17, further comprising maintaining a pressure within the reaction chamber in the range of about 10 to 100 mtorr during the cleaning phase.

19. The method of claim 17, further comprising providing a negative voltage bias within a range of about 50 to 150 volts to the device structure during at least a portion of the cleaning phase.

20. The method of claim 17, wherein generating the high density plasma containing ionized gas particles during the cleaning phase comprises generating ionized gas particles having energies in the range of about 0 to 50 eV.

21. The method of claim 17, wherein the sputter target is selected from the group consisting of Ti, Pt, Mo, W, Au, Ni, Co, Al, Ta, Si and combinations thereof.

22. The method of claim 17, wherein the high density plasma comprises at least $10^{11}$ particles per cubic centimeter.

23. The method of claim 17, further comprising generating plasma prior to the deposition phase.

24. The method of claim 23, wherein generating plasma prior to the deposition phase comprises generating plasma containing ionized gas particles having energies in the range of about 50 eV to 2 keV.

25. The method of claim 17, wherein the device structure comprises a high aspect ratio device structure.

26. The method of claim 17, wherein the defined opening comprises one or more of a trench, via, hole, depression, or interconnect formed in the structure.

* * * * *